United States Patent [19]
Philips et al.

[11] 3,946,337
[45] Mar. 23, 1976

[54] PHASE MODULATOR FOR PHASE SHIFT KEY COMMUNICATIONS SYSTEMS

[75] Inventors: William D. Philips, Fort Lauderdale; William H. Franklin, Jr., Coral Springs, both of Fla.

[73] Assignee: The Bendix Corporation, Southfield, Mich.

[22] Filed: Apr. 25, 1975

[21] Appl. No.: 571,465

[52] U.S. Cl. ................. 332/22; 325/161; 332/30 V
[51] Int. Cl.² ...................... H03C 3/22; H04L 27/20
[58] Field of Search ........ 332/1, 9 R, 9 T, 10, 16 R, 332/16 T, 22, 30 V; 325/45, 145, 161, 163

[56] References Cited
UNITED STATES PATENTS

| | | |
|---|---|---|
| 2,923,891 | 2/1960 | Nicholson, Jr. .................. 332/16 R |
| 3,454,904 | 7/1969 | Clites et al. ....................... 332/16 T |

*Primary Examiner*—Siegfried H. Grimm
*Attorney, Agent, or Firm*—W. G. Christoforo; Bruce L. Lamb

[57] ABSTRACT

A carrier wave is directed through a voltage controlled phase shifter to a load. A sample of the signal at the output of the voltage controlled phase shifter is selectably applied, in accordance with modulation information, through one of a plurality of transmission line phase shifters to a phase detector which also receives a sample of the carrier wave. The resulting phase detector output signal is applied through a low pass filter to control the voltage controlled phase shifter.

5 Claims, 1 Drawing Figure

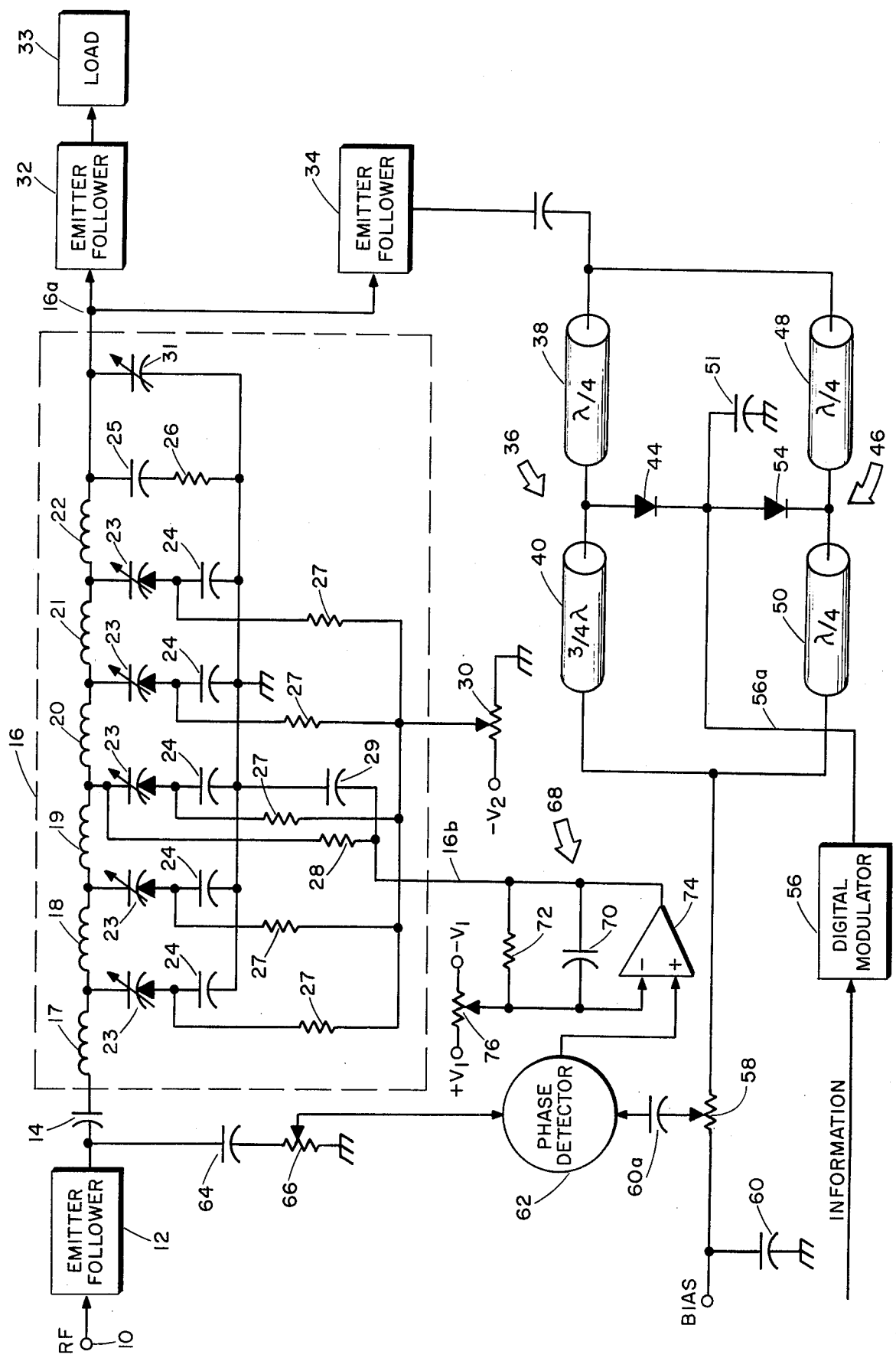

PHASE MODULATOR FOR PHASE SHIFT KEY COMMUNICATIONS SYSTEMS

BACKGROUND OF THE INVENTION

The present invention relates to communications systems and more particularly to a differentially phase modulated communication transmission system.

In the field of communications it has been the general practice to transmit digital information by periodically varying the phase of a carrier signal in accordance with the information being transmitted. If the phase of the carrier signal is varied instantaneously by, for example, balanced modulation, overtones and beat frequencies will be generated, thereby substantially increasing the bandwidth of the communications channel. However, if phase variation of the carrier signal can be accomplished gradually then the bandwidth required for the communications channel will be relatively narrow.

In the present invention a carrier frequency is phase modulated by directing it through a voltage controlled phase shifter to a load, with the voltage controlled phase shifter being controlled in response to the phase difference between the carrier frequency and the signal output of the voltage controlled phase shifter as directed through one of a plurality of fixed phase shifters, which is selected in accordance with the desired modulation.

A phase detector is used to generate a signal which is related to the phase difference between the carrier frequency and the output from the voltage controlled phase shifter as directed through the selected fixed phase shifter. This signal is applied through a low pass filter to control the voltage controlled phase shifter.

It is a primary object of this invention to provide a phase modulator adapted for use in a phase shift key (PSK) communications system.

Another object of this invention is to provide a PSK communications system which requires a relatively narrow bandwidth channel for its utilization.

A still further object of this invention is to provide a phase modulator for use in a PSK communications system which does not introduce undesirable amplitude modulation to the signal being modulated.

These and other objects of the invention will become apparent from a reading and understanding of the following description of the preferred embodiment taken together with the FIGURE which is a modified block diagram of the preferred embodiment of the invention.

DESCRIPTION OF THE PREFERRED EMBODIMENT

Referring to the FIGURE, an unmodulated raw carrier frequency to be modulated in accordance with the principles of this invention is impressed at a terminal 10 and applied through emitter follower 12 and capacitor 14 to a voltage controlled phase shifter 16, wherein the phase of the carrier frequency is varied in accordance with the signal on line 16b. The voltage controlled phase shifter can be of the suitable type known in the art, this particular embodiment being comprised of inductors 17 through 22 serially connected between the input and output terminals, together with a plurality of voltage variable capacitive means, each connected between a junction point of the inductors and a common terminal which is here illustrated as RF ground. Each of the voltage variable capacitive means includes a voltage variable capacitor 23 serially connected with a fixed capacitor 24. The output terminal 16a of the voltage controlled phase shifter is connected to ground through capacitor 25 and resistor 26 arranged in series and shunted by variable capacitor 31. Capacitor 25 and resistor 26 are used to provide a resistive load to the voltage controlled phase shifter at its characteristic impedance while variable capacitor 31 is used to fine tune the voltage controlled phase shifter characteristic impedance so as to correct for small amplitude perturbations during phase changes. The voltage bias on each voltage variable capacitive means is initially set by a voltage obtained from potentiometer 30 and applied through resistors 27 to the common junction of a voltage variable capacitor 23 and fixed capacitor 24. The control signal on line 16b, which is a d.c. voltage signal, is applied to the opposite side of the voltage variable capacitors through a resistor 28 and the line of RF coils 18–21. A shunt capacitor 29 shunts undesired voltage perturbations on control line 16b to ground.

A relatively complex voltage controlled phase shifter is shown in this embodiment for the purposes of illustration, it being desired that the voltage controlled phase shifter introduce negligible or no amplitude modulation to the carrier frequency as the characteristics of the voltage controlled phase shifter vary in accordance with the signal on line 16b. As an alternative, a simpler phase shifter of the type known in the art or obvious to one skilled in the art can be used together with a limiter connected to the phase shifter output terminal to eliminate AM modulation of the carrier frequency. Of course, if slight AM modulation (less than 20 percent) of the carrier frequency is not of concern the limiter may also be eliminated.

Returning to the present embodiment, the phase shifted carrier frequency at the output terminal 16a of voltage controlled phase shifter 16 is directed through emitter follower 32 to a load 33 which, for example, can be a power amplifier. Output terminal 16a is also connected to a second emitter follower 34 which samples the phase shifted carrier frequency, which sample is capacitively coupled to fixed phase shifters 36 and 46. The purpose of emitter followers 32 and 34 is, of course, to prevent loading of the voltage controlled phase shifter.

Fixed phase shifters 36 and 46 are preferably comprised of sections of transmission lines, fixed phase shifter 36 being comprised of a quarter wavelength transmission line section 38 and a three-quarters wavelength transmission line section 40 while fixed phase shifter 46 is comprised of a quarter wavelength transmission line section 48 and a further quarter wavelength transmission line section 50. The junction points of the transmission line section of each fixed phase shifter are switchably coupled through capacitor 51 to ground by diode 44 and diode 54, respectively. In this particular embodiment it is assumed that the carrier frequency is to be modulated in accordance with binary information and hence, the carrier frequency is preferably to be shifted by 180° so that two signal levels or senses will be produced by the voltage controlled phase shifter.

It will become obvious to one skilled in the art as this description proceeds that other modulation schemes can be practiced with the present invention, such as three level or four level modulation schemes, by the addition of further fixed phase shifters together with switching means to be described.

In accordance with the modulation scheme here being illustrated it can be seen that the length of the transmission line comprising fixed phase shifter 36 differs by 180 electrical degrees from the length of the transmission line comprising fixed phase shifter 46. In addition, it is assumed that the information applied to digital modulator 56 is in binary form and produces in accordance therewith a two level voltage signal on line 56a which is impressed at the common terminal of PIN diodes 44 and 54. This signal causes one or the other of the diodes to be forward biased, thus shunting the signal at its associated transmission line to ground. The signal traversing the other fixed phase shifter passes therethrough relatively unimpeded and is impressed across potentiometer 58 and capacitor 60. The quarter wavelength transmission line section of each fixed phase shifter prevents undesired signal reflections when a particular fixed phase shifter is shunted to ground by the action of diode 44 or 54.

The signal traversing the unshunted fixed phase shifter is sampled at potentiometer 58 through d.c. blocking capacitor 60a and compared in phase detector 62 with a sample of the raw carrier frequency obtained from the output terminal of emitter follower 12 as impressed across the serial arrangement of capacitor 64 and potentiometer 66. The phase detector error signal is applied to the non-inverting input terminal of operational amplifier 74 which, together with capacitor 70 and resistor 72 connected in parallel with one another between the output terminal 16b of operational amplifier 74 and its inverting input terminal comprises an active amplifier low pass filter whose d.c. operating point is set by potentiometer 76 connected across the voltage source as shown. Capacitor 70 and resistor 72 set the time constant of the low pass filter. As seen, the output terminal of operational amplifier 74 comprises control line 16b.

Returning to fixed phase shifters 36 and 46, it should be understood that one fixed phase shifter could have an electrical length of 0 electrical degrees and the other phase shifter have an electrical length of 180 electrical degrees. However, in addition to the desirability of quarter wavelength transmission line sections to isolate the shunting points of the various fixed phase shifters as previously explained, it is also desirable that each fixed phase shifter have a finite electrical length so that all are affected alike by temperature. It is, of course, assumed that both of the fixed phase shifters are exposed to the same environmental conditions.

It should be obvious that due to low pass filter 68 the signal at line 16b will not change instantaneously when the signal on line 56a changes. Rather, the signal on line 16b will change relatively slowly between two extreme values, one value corresponding to a binary "0" to be transmitted and the other value corresponding to a binary "1" to be transmitted. The rate at which the signal on line 16b can change is determined in a known manner by the low pass filter 68. Since the signal on line 16b is not changed instantaneously then the phase of the signal at terminal 16a will not change instantaneously so that the RF sideband of the modulated carrier frequency signal will be very much attenuated resulting in a conservation of the communication channel bandwidth.

It should also be noted that the signal at terminal 16a is at all times continuous so that the undesirable amplitude modulation found in certain of the prior art devices where the signal is interrupted during phase changes is not present here. As for any amplitude modulation that might be introduced by the varying of impedance of the voltage controlled phase shifter during its operation, particularly if a less complex voltage controlled phase shifter is used, this can be eliminated at the designer's option by inserting a limiting amplifier at terminal 16a as previously explained.

Further modifications and alterations of the present invention should now be obvious to one skilled in the art. Accordingly, the invention is to be limited only by the true scope and spirit of the appended claims.

The invention claimed is:

1. A phase modulator comprising
   means for generating a raw carrier frequency;
   means responsive to a control signal for shifting the phase of said raw carrier frequency to produce a phase shifted carrier frequency;
   at least first and second means, a signal applied to said first means being shifted a predetermined number of electrical degrees with respect to a signal applied to said second means;
   switch means for applying a sample of said phase shifted carrier frequency to one of said first and second means and subsequently to the other of said first and second means in accordance with information to be conveyed by said phase shifted carrier frequency;
   phase detector means for generating an output signal related to the phase difference between said raw carrier frequency and the signal from said first and second means; and,
   low pass filter means responsive to said output signal for generating the control signal for said means for shifting.

2. The phase modulator of claim 1 wherein said means for shifting comprises a voltage controlled phase shifter continuously producing said carrier frequency phase shifted in accordance with said control signal.

3. The phase modulator of claim 2 wherein said first means comprises a first transmission line means and said second means comprises a second transmission line means, each of said first and second transmission line means having respectively a quarter wavelength transmission line section having first ends connected together and second ends connectable through said switch means to a signal return terminal.

4. The phase modulator of claim 3 wherein said low pass filter means comprises an operational amplifier connected as an active amplifier low pass filter.

5. The phase modulator of claim 2 wherein at least one of said first and second means comprises a length of transmission line having a predetermined phase shift therethrough to a signal having the frequency of said carrier frequency.

* * * * *